United States Patent
Suzuki

(10) Patent No.: US 7,550,797 B2
(45) Date of Patent: Jun. 23, 2009

(54) PHOTOELECTRIC CONVERSION LAYER STACK TYPE COLOR SOLID-STATE IMAGE SENSING DEVICE

(75) Inventor: Nobuo Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 328 days.

(21) Appl. No.: 11/386,819

(22) Filed: Mar. 23, 2006

(65) Prior Publication Data

US 2006/0214166 A1 Sep. 28, 2006

(30) Foreign Application Priority Data

Mar. 25, 2005 (JP) .......................... P.2005-088468

(51) Int. Cl.
*H01L 27/146* (2006.01)
(52) U.S. Cl. ................ 257/291; 257/292; 257/E27.135
(58) Field of Classification Search .................... 257/59, 257/79, 184, 187, 225, 291, 292, 294
See application file for complete search history.

(56) References Cited

U.S. PATENT DOCUMENTS 7,129,466 B2 * 10/2006 Iwasaki .................... 250/214.1
7,230,226 B2 * 6/2007 Inuiya ..................... 250/208.1
7,335,869 B2 * 2/2008 Kochi ...................... 250/208.1
2003/0071271 A1 * 4/2003 Suzuki et al. ................. 257/98
2003/0209651 A1 * 11/2003 Iwasaki .................... 250/214.1

FOREIGN PATENT DOCUMENTS

| JP | 2002-83946 A | 3/2002 |
| WO | WO 99/39372 A2 | 8/1999 |
| WO | WO 99/56097 A1 | 11/1999 |

* cited by examiner

*Primary Examiner*—Marcos D. Pizarro
*Assistant Examiner*—Tifney L Skyles
(74) *Attorney, Agent, or Firm*—Sughrue Mion, PLLC

(57) ABSTRACT

A color solid-state image sensing device comprising unit cells arranged two-dimensionally in a surface of a silicon substrate, each unit cell including a blue pixel provided as defined herein, a red pixel as defined herein and a green pixel as defined herein, wherein the relation P≧W holds when W is a distance between the position of the center of gravity in a sensitivity distribution of the green pixel and the position of the center of gravity in a sensitivity distribution of the red pixel, and P is a pitch of arrangement of the unit cells.

14 Claims, 4 Drawing Sheets

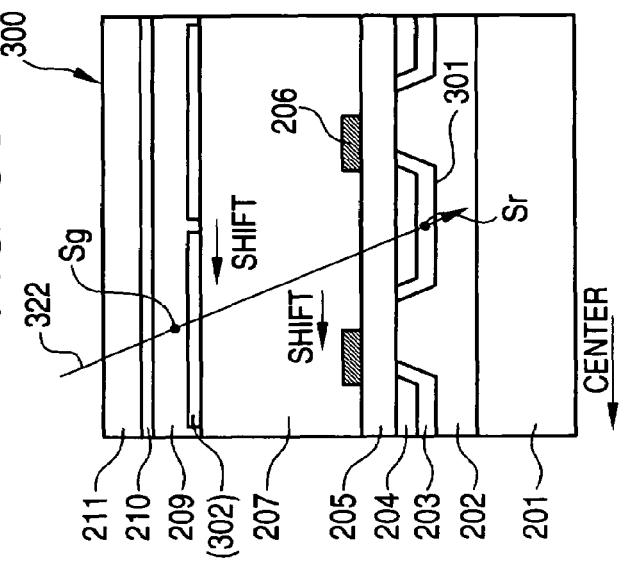
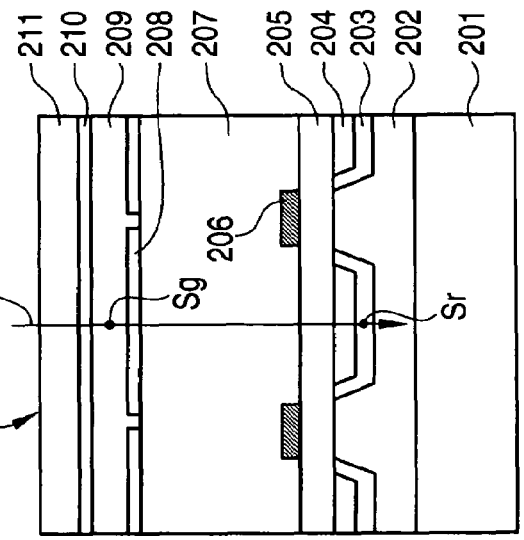
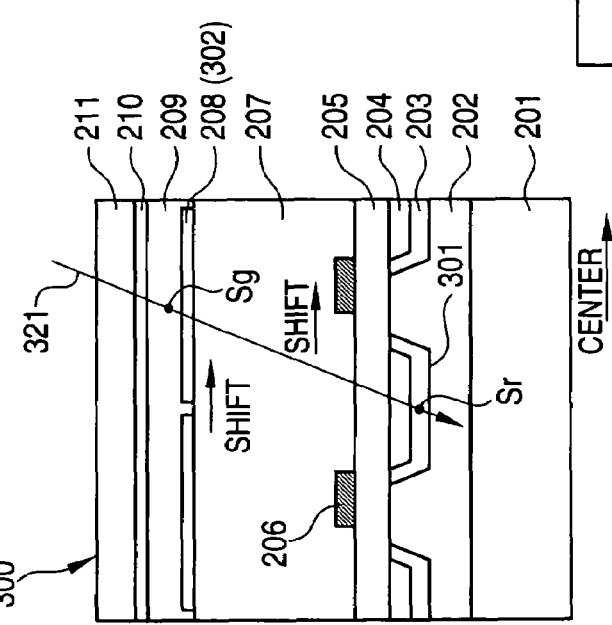

Z DIRECTION

X DIRECTION

PHOTOELECTRIC CONVERSION LAYER STACK TYPE COLOR SOLID-STATE IMAGE SENSING DEVICE

FIELD OF THE INVENTION

The present invention relates to a color solid-state image sensing device for detecting signals of the three colors of red (R), green (G) and blue (B) per pixel. Particularly, it relates to a photoelectric conversion layer stack type color solid-state image sensing device in which blue light and red light are detected by photodiodes provided in a semiconductor substrate and green light is detected by a photoelectric conversion layer stacked on the semiconductor substrate.

BACKGROUND OF THE INVENTION

In a background-art single plate-type color solid-state image sensing device represented by a CCD image sensor or a CMOS image sensor, respective color filters of R, G and B are mounted mosaically on an array of photoelectric conversion pixels (photodiodes). Color signals outputted from the respective pixels of the color solid-state image sensing device in accordance with the color filters are processed to generate a color image.

In the color solid-state image sensing device having the color filters arranged mosaically, when color filters of the three primary colors (R, G and B) are provided as the color filters, each color filter absorbs two thirds of light incident on the color solid-state image sensing device. Accordingly, there is a disadvantage that the color solid-state image sensing device is poor in light utilization efficiency and low in sensitivity. In addition, since a color signal of only one color per pixel can be obtained, there is another disadvantage that the color solid-state image sensing device is poor in resolution and particularly conspicuous in false color.

In order to overcome such disadvantages, therefore, an image sensing device having three layers of photoelectric conversion layers stacked, for example, as described in JP-T-2002-502120 (corresponding to WO 99/39372) and JP-A-2002-83946 has been examined and developed. This image sensing device has a pixel structure in which, for example, three layers of photoelectric conversion layers for generating signal charge (electrons or holes) in response to blue (B) light, green (G) light and red (R) light respectively are stacked successively viewed from a light incidence surface. In addition, this image sensing device has signal reading circuits for independently reading the signal charges optically generated in the photoelectric conversion layers respectively in accordance with each pixel. In the case of the image sensing device, almost of the incident light is photoelectrically converted so that utilization efficiency of visible light is almost about 100%. In addition, the image sensing device has such a structure that color signals of the three colors of R, G and B can be obtained in one pixel. Thus, there is an advantage that the image sensing device can obtain a good image with high sensitivity, high resolution and inconspicuous false color.

In an image sensing device described in JP-T-2002-513145 (corresponding to WO 99/56097), three layers of wells (photodiodes) for detecting optical signals are provided in a silicon substrate so that signals different in spectral sensitivity are taken out in accordance with difference in depth of the silicon substrate. That is, the image sensing device is designed so that a signal having a peak in blue (B) is taken out from a pn junction portion in the surface of the silicon substrate, a signal having a peak in green (G) is taken out from a pn junction portion in an intermediate portion of the silicon substrate and a signal having a peak in red (R) is taken out from a pn junction portion in a deep portion of the silicon substrate. Similarly to the image sensing device described in JP-T-2002-502120 and JP-A-2002-83946, this image sensing device can sense a good image with high sensitivity and high resolution (inconspicuous false color).

In the image sensing device described in JP-T-2002-502120 and JP-A-2002-83946, the three layers of photoelectric conversion layers need to be stacked on the substrate, and it is difficult to form vertical wires by which pixel electrode layers provided separately in accordance with the photoelectric conversion layers and the pixels are connected to the signal reading circuits provided on the substrate, respectively. There arises a problem that the production process is complex to bring increase in cost and reduction in production yield.

On the other hand, in the image sensing device according to JP-T-2002-513145, separation of spectral sensitivity characteristics of the color signals of R, G and B is not sufficient so that color reproducibility is poor. In addition, it is necessary to add and subtract output signals for obtaining true R, G and B signals. There is a problem that S/N is deteriorated by the addition and subtraction process.

An image sensing device described in JP-A-2003-332551 (corresponding to US Publication 2003/0209651) has been therefore proposed as an image sensing device to solve the problems belonging to JP-T-2002-502120 and JP-A-2002-83946 and JP-T-2002-513145. This image sensing device is of a hybrid type between the image sensing device described in JP-T-2002-502120 and JP-A-2002-83946 and the image sensing device described in JP-T-2002-513145. That is, this image sensing device is configured in such a manner that while only one layer of photoelectric conversion layer having sensitivity to green (G) light is stacked as an upper layer on a silicon substrate, two pn junction portions (photodiodes) are provided in the depth direction of the silicon substrate so that a blue (B) light signal is taken out from the pn junction portion in a shallow portion of the silicon substrate and a red (R) light signal is taken out from the pn junction portion in a deep portion of the silicon substrate.

Since this image sensing device has only one layer of photoelectric conversion layer, there is an advantage that a process for producing the image sensing device is so simple that increase in production cost can be suppressed and reduction in production yield can be almost avoided. In addition, the image sensing device is designed in such a manner that green (G) light is absorbed to the photoelectric conversion layer so that only blue (B) light and red (R) light can be made incident on the silicon substrate. Thus, separation of spectral sensitivity characteristics of the pn junction portion for blue light and the pn junction portion for red light in the silicon substrate can be improved, so that color reproducibility becomes good and an image with good S/N can be sensed.

SUMMARY OF THE INVENTION

In the hybrid type image sensing device described in JP-A-2003-332551, there is a problem that false color is conspicuous in the peripheries of photo acceptance portions of the image sensing device. The reason will be described below with reference to FIG. 4.

FIG. 4 is a schematic view of a section of the hybrid photoelectric conversion layer stack type color solid-state image sensing device. As illustrated in FIG. 4, three pixels (unit cells) for detecting signals of the three colors of red (R), green (G) and blue (B) are arranged in a row.

Parts of a p-type semiconductor layer 102 are formed in deep portions with respect to a surface portion of an n-type semiconductor substrate 101. Parts of an n-type semiconductor layer 103 are formed in the surface portion of the n-type semiconductor substrate 101. A pn junction formed between each part of the semiconductor layer 103 and each part of the semiconductor layer 102 forms a first photodiode for detecting blue (B) light. A pn junction formed between each part of the semiconductor layer 102 and the semiconductor substrate 101 forms a second photodiode for detecting red (R) light.

A transparent electrically insulating layer 104 is stacked on the surface portion of the semiconductor substrate 101. Parts of a transparent pixel electrode layer 105 provided separately in accordance with the pixels are stacked on the transparent electrically insulating layer 104. A photoelectric conversion layer 106 formed as a sheet common with the pixels is stacked on the transparent pixel electrode layer 105. Green light is detected by the photoelectric conversion layer 106. A transparent common electrode layer 107 formed as a sheet common with the pixels is stacked on the photoelectric conversion layer 106. A transparent protective layer 108 is stacked on the transparent common electrode layer 107.

This photoelectric conversion layer stack type color solid-state image sensing device is applied to a use purpose such as a camera or a digital still camera mounted in a portable phone requested for compactness, low price and high resolution. A pixel pitch of the photoelectric conversion layer stack type color solid-state image sensing device is small, for example, to be 3 μm.

When a pixel portion for detecting red is regarded as an R pixel, a pixel portion for detecting green is regarded as a G pixel and a pixel portion for detecting blue is regarded as a B pixel, an area of each of the R pixel and the B pixel belonging to one pixel (one unit cell) constituted by the R pixel, the B pixel and the G pixel is smaller than that of the G pixel. It is because signal reading circuits (i.e. charge transfer paths in the case of a CCD type, or MOS transistor circuits in the case of a CMOS type) is necessarily provided on the semiconductor substrate 101 provided with the R pixels and the B pixels.

The B pixels are provided in shallow portions with respect to the surface portion of the semiconductor substrate 101 and the R pixels are provided in places deeper by about 1.2 μm than the B pixels. On the other hand, the G pixels are provided on the electrically insulating layer 104 so as to be separate from the surface of the semiconductor substrate 101 by about 3 μm to 4 μm.

Further, the thickness of each G pixel, i.e. the thickness of the photoelectric conversion layer 106 is about 0.5 μm to 1 μm. Accordingly, the G pixel is farthermost from the R pixel belonging to one pixel constituted by the R pixel, the G pixel and the B pixel. The distance between the G pixel and the R pixel is not shorter than 4 μm to 5 μm.

A chief light ray 110 passing through the center of a stop in the center of a photo acceptance portion of the image sensing device is incident substantially vertically on the surface of the semiconductor substrate 101. In response to the chief light ray 110, output signals of the G pixel, the B pixel and the R pixel are coincident with the relative positional relation of G, B and R in an optical image.

A chief light ray 111 from the periphery of the photo acceptance portion is incident obliquely to the surface of the semiconductor substrate 101 by 15 degrees to 30 degrees. Although this incidence angle depends on the size of the photo acceptance portion of the image sensing device and optical characteristic of an imaging optical system to be used, this incidence angle often becomes an angle in the range of from 15 degrees to 30 degrees in a use purpose such as a portable phone or a digital still camera requiring reduction in size and thickness. Accordingly, a shift of about 2.1 μm between a formed optical image in the G pixel and a formed optical image in the R pixel (in the case where the incidence angle is 25 degrees and the distance between the R pixel and the G pixel is 4.5 μm) is generated in the periphery of the photo acceptance portion. This shift becomes a phase difference between the G signal and the R signal with respect to the incident optical image.

It is a matter of course that false color is not generated if the phase difference is zero (correspondingly to the vicinity of the center of the photo acceptance portion). As the phase difference is increased, false color becomes more conspicuous. Particularly when the phase difference exceeds 90 degrees, peaks and bottoms of the G signal and the R signal are reverse to each other with respect to the incident optical image so that false color becomes extremely conspicuous. A spatial frequency at which false color is most conspicuous is a Nyquist frequency highest in frequency.

When a pitch between adjacent ones of the pixels arranged is regarded as P, the wavelength of the Nyquist frequency of the photo acceptance portion is 2P. When the pixel pitch is 3 μm, a shift of 2.1 μm is equivalent to the phase difference of about 126 degrees. Since this shift exceeds 90 degrees, false color is very conspicuous. That is, there is a problem that false color in the hybrid photoelectric conversion layer stack type color solid-state image sensing device according to the background art becomes more conspicuous as the location goes toward the periphery of each photo acceptance portion.

An object of the invention is to provide a hybrid photoelectric conversion layer stack type color solid-state image sensing device in which false color in the periphery of each photo acceptance portion is reduced.

The photoelectric conversion layer stack type color solid-state image sensing device according to the invention is a photoelectric conversion layer stack type color solid-state image sensing device having unit cells arranged two-dimensionally in a surface of a silicon substrate, each unit cell including a blue pixel for detecting blue light, a red pixel for detecting red light, and a green pixel for detecting green light, the blue pixel being provided as a photodiode formed in the surface of the silicon substrate, the red pixel being provided as a photodiode formed under the blue pixel, the green pixel being provided as a photoelectric conversion layer stacked above the silicon substrate so as to be interposed between a corresponding part of a pixel electrode layer partitioned into parts in accordance with the pixels and a common electrode layer, the blue pixel, the red pixel and the green pixel being arranged in a direction perpendicular to the surface of the silicon substrate, wherein the relation $P \geqq W$ holds when W is a distance between the position of the center of gravity in a sensitivity distribution of the green pixel and the position of the center of gravity in a sensitivity distribution of the red pixel, and P is a pitch of arrangement of the unit cells.

In the photoelectric conversion layer stack type color solid-state image sensing device according to the invention, micro lenses are provided above the green pixels respectively.

The photoelectric conversion layer stack type color solid-state image sensing device according to the invention is a photoelectric conversion layer stack type color solid-state image sensing device having unit cells arranged two-dimensionally in a surface of a silicon substrate, each unit cell including a blue pixel for detecting blue light, a red pixel for detecting red light, and a green pixel for detecting green light, the blue pixel being provided as a photodiode formed in the surface of the silicon substrate, the red pixel being provided as a photodiode formed under the blue pixel, the green pixel being provided as a photoelectric conversion layer stacked above the silicon substrate so as to be interposed between a corresponding part of a pixel electrode layer partitioned into parts in accordance with the pixels and a common electrode layer, wherein as the position of each of the unit cells arranged two-dimensionally becomes farther from the center of a photo acceptance portion of the image sensing device, the position of the green pixel formed in the unit cell is shifted toward the center of the photo acceptance portion of the image sensing device by a predetermined shift quantity relative to the position of the red pixel.

In the photoelectric conversion layer stack type color solid-state image sensing device according to the invention, the predetermined shift quantity is determined in accordance with inclination of a chief light ray incident on the unit cell.

In the photoelectric conversion layer stack type color solid-state image sensing device according to the invention, a light blocking layer having apertures formed on the blue pixels respectively is formed on the silicon substrate; and each of the apertures of the light blocking layer is shifted toward the center of the photo acceptance portion of the image sensing device in accordance with inclination of the chief light ray.

In the photoelectric conversion layer stack type color solid-state image sensing device according to the invention, micro lenses are provided above the green pixels respectively.

In the photoelectric conversion layer stack type color solid-state image sensing device according to the invention, each of the micro lenses is shifted relative to corresponding one of the green pixels in accordance with inclination of the chief light ray.

In the photoelectric conversion layer stack type color solid-state image sensing device according to the invention, regions for storing signal charge detected by the green pixels and signal reading circuits for reading signals from the regions, the blue pixels and the red pixels respectively are formed in a surface portion of the silicon substrate.

In the photoelectric conversion layer stack type color solid-state image sensing device according to the invention, the photoelectric conversion layer is made of organic semiconductor.

According to the invention, generation of false color in the periphery of each photo acceptance portion in an image sensing device can be suppressed so that a color image with high resolution and high quality can be sensed.

BRIEF DESCRIPTION OF THE DRAWINGS

FIGS. 3A to 3C are schematic views of sections of unit cells at points A, B and C in FIG. 2, respectively.

DETAILED DESCRIPTION OF THE INVENTION

An embodiment of the invention will be described below with reference to the drawings.

First Embodiment

Figure 1:
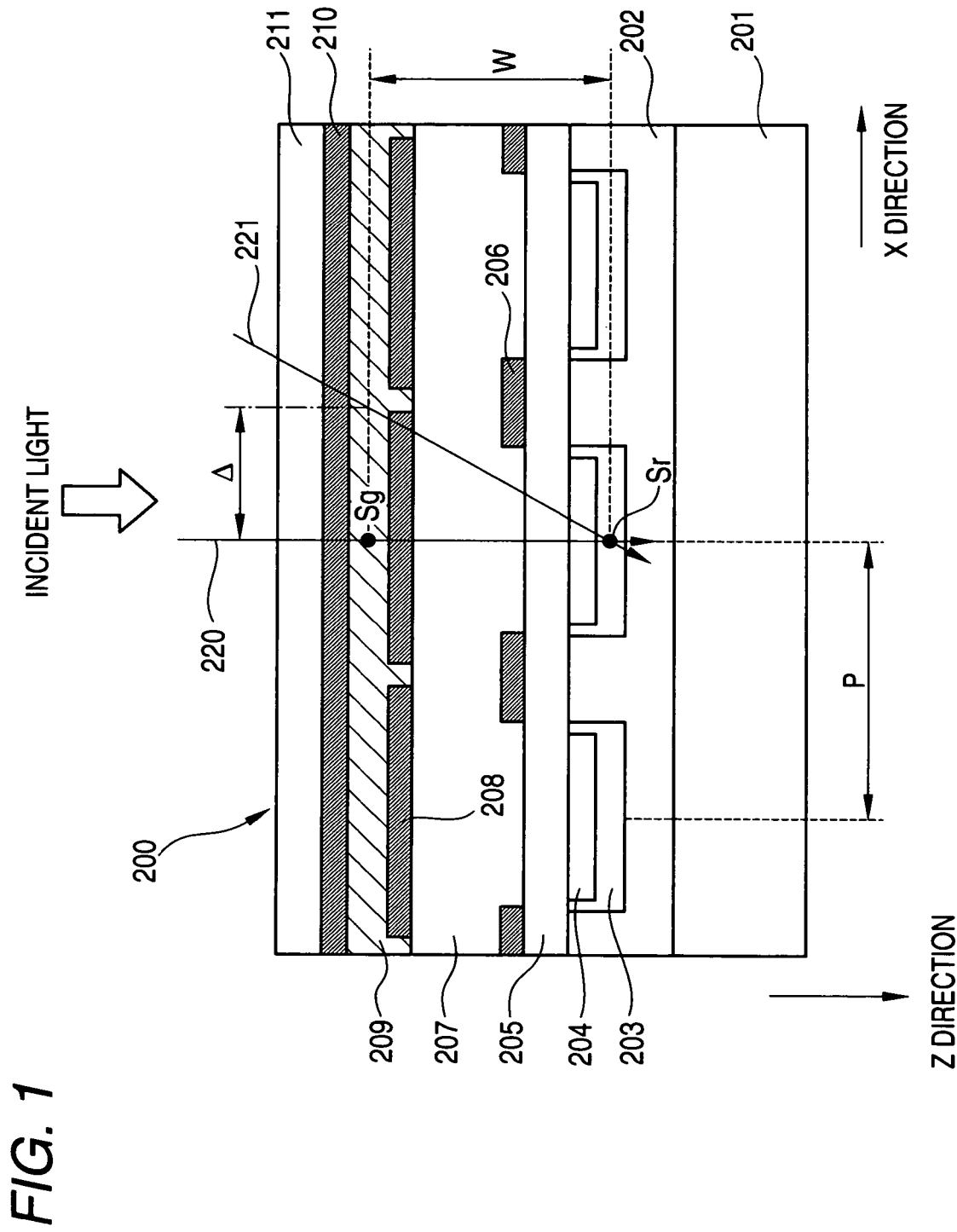
FIG. 1 is a schematic sectional view showing three unit cells in a hybrid photoelectric conversion layer stack type color solid-state image sensing device according to a first embodiment of the invention.

FIG. 1 is a schematic sectional view showing three unit cells in a hybrid photoelectric conversion layer stack type color solid-state image sensing device according to a first embodiment of the invention. The photoelectric conversion layer stack type color solid-state image sensing device 200 according to the embodiment has: a p-type silicon substrate 201; a p-type well 202 formed in a front surface of the p-type silicon substrate 201; an n-type semiconductor layer 203 formed in a deep portion with respect to a front surface of the p-type well 202; and a p-type semiconductor layer 204 formed in a shallow portion with respect to the front surface of the p-type well 202 so as to be adjacent to the n-type semiconductor layer 203.

A plurality of pn junctions formed between the semiconductor layers 203 and 204 constitute photodiodes (B pixels) for detecting blue light. A plurality of pn junctions formed between the semiconductor layer 203 and the p-type well 202 constitute photodiodes (R pixels) for detecting red light. Incidentally, it is a matter of course that the electric conduction types of the semiconductor layers 203 and 204, the well 202 and the silicon semiconductor 201 are not limited thereto and may be opposite to the aforementioned electric conduction types.

The whole front surface of the semiconductor substrate 201 is covered with a transparent electrically insulating layer 205. A light blocking layer 206 is formed in a predetermined place on the transparent electrically insulating layer 205 so that the light blocking layer 206 blocks light between a photo acceptance surface of a photodiode forming a certain pixel and a photo acceptance surface of a photodiode forming a pixel adjacent to the certain pixel in an X direction. A transparent electrically insulating layer 207 is formed on the light blocking layer 206.

A transparent pixel electrode layer 208 partitioned into parts in accordance with pixels is formed on the electrically insulating layer 207. A photoelectric conversion layer 209 provided as a sheet common with all the pixels is formed on the transparent pixel electrode layer 208 so that the photoelectric conversion layer 209 absorbs a green light component to thereby convert the green light component into an electric signal. A transparent common electrode layer 210 also provided as a sheet is formed on the photoelectric conversion layer 209. A transparent protective layer 211 is formed as an uppermost layer. The common electrode layer 210 may be formed so as to be partitioned into parts in accordance with the pixels.

Each of the pixel electrode layer 208 and the common electrode layer 210 is provided as a layer made of a metal compound such as ITO or of a thin metal.

The photoelectric conversion layer 209 may be provided as a monolayer structure or as a multilayer structure. The photoelectric conversion layer 209 is made of an inorganic material (such as silicon, compound semiconductor or nanoparticles thereof) chiefly sensitive to green, or of an organic or inorganic material containing organic semiconductor, an organic pigment, or the like. Parts of the photoelectric conversion layer 209 interposed between the common electrode layer 210 and the parts of the pixel electrode layer 208 constitute G pixels respectively, so that the size (width) of each G pixel is equal to the size of each part of the pixel electrode layer 208.

Though not shown, signal reading circuits (charge transfer paths in the case of a CCD type or MOS transistor circuits in the case of a CMOS type) and green signal charge storage regions are formed in the front surface portion of the silicon substrate 201 so as to be located in positions blocked by the light blocking layer 206. Each part of the pixel electrode layer 208 is connected to a corresponding green signal charge storage region by a vertical wire not shown.

When light 220 from a subject is incident on the photoelectric conversion layer stack type color solid-state image sensing device 200, a green light component of the incident light is absorbed to the photoelectric conversion layer 209 so that optical charge is generated in the photoelectric conversion layer 209. The optical charge is poured from the pixel electrode layer 208 into the green signal charge storage regions not shown and stored in the green signal charge storage regions.

A mixture of a blue light component and a red light component transmitted through the photoelectric conversion layer 209 enters the silicon substrate 201. The blue light component short in wavelength is chiefly absorbed to a shallow portion (near the semiconductor layers 203 and 204) of the semiconductor substrate 201, so that electric charge generated thus is stored in photodiodes for B pixels. The red light component long in wavelength is chiefly absorbed to a deep portion (near the semiconductor layer 203 and the p-type well 202) of the semiconductor substrate 201, so that electric charge generated thus is stored in photodiodes for R pixels.

Signal charges corresponding to red (R), green (G) and blue (B) are output from the photoelectric conversion layer stack type color solid-state image sensing device 200 by the signal reading circuits (not shown) in the same manner as that in a CCD image sensor or a CMOS image sensor according to the background art.

The above description has been given to operation when the incident light 220 is incident substantially perpendicularly on the surface of the substrate 201. The photoelectric conversion layer stack type color solid-state image sensing device 200 according to this embodiment is produced to have the flowing size and shape so that false color can be suppressed even when light 221 is incident obliquely on a pixel in a peripheral portion of the device.

In the photoelectric conversion layer stack type color solid-state image sensing device 200 according to the embodiment, each unit cell (one pixel) is constituted by a G pixel, a B pixel and an R pixel arranged in a direction vertical to the surface of the substrate. The invention is characterized in that the photoelectric conversion layer stack type color solid-state imaging sensing device is produced so that a Z-direction (vertical direction to the surface) distance W between the center of gravity Sg in the sensitivity distribution of the G pixel and the center of gravity Sr in the sensitivity distribution of the R pixel with respect to an X-direction pitch P of arrangement of the unit cells is not larger than P, i.e. W≦P. The pitches concerning the unit cell are different in the X direction (line direction) along the surface of the silicon substrate 201 and the Y direction (row direction), the short pitch is referred to as "P" as described above.

In the case where the pixel electrode layer 208 is shaped like a square or rectangle, the center of the square or rectangle coincides with the center of gravity Sg in the sensitivity distribution of the G pixel in the XY plane. Strictly, the position of the center of gravity Sg of the G pixel in the thickness direction does not coincide with the position of a bisector dividing the thickness of the photoelectric conversion layer 209 into two equal parts because the light absorption state varies in accordance with the thickness of the photoelectric conversion layer 209. The error is however small even in the case where the position of a bisector dividing the thickness of the photoelectric conversion layer 209 into two equal parts is regarded as the position of the center of gravity of the G pixel.

In the case where the semiconductor layer 203 is shaped like a square or rectangle, the center of the square or rectangle coincides with the center of gravity Sr in the sensitivity distribution of the R pixel in the XY plane. Strictly, the position of the center of gravity of the R pixel in the thickness direction does not coincide with the position of a bisector dividing the thickness of the semiconductor layer 203 into two equal parts because the light absorption state varies in accordance with the structure of the photodiode. The error is however small even in the case where the position of a bisector dividing the thickness of the semiconductor layer 203 into two equal parts is approximately regarded as the position of the center of gravity of the R pixel.

Accordingly, the distance between the center of the thickness of the photoelectric conversion layer 209 and the center of the thickness of the semiconductor layer 203 can be regarded as "W" as described above.

Inclination of the chief light ray 221 in the unit cell in the peripheral portion of the photoelectric conversion layer stack type color solid-state image sensing device 200 configured as described above also depends on the size of the color solid-state image sensing device 200. Generally, inclination of the chief light ray 221 is often 25 degrees or lower. In the case of P=W, positional shift Δ between the G signal and the R signal is the largest. Accordingly, when the incidence angle is 25 degrees and P=W, the positional shift Δ between the G signal and the R signal is the largest and the shift quantity Δ is about P/2. The wavelength of the Nyquist frequency of the array of pixels with the pitch P is 2P. P/2 is equivalent to the phase of 90 degrees. That is, in the photoelectric conversion layer stack type color solid-state image sensing device 200 according to the embodiment, the phase difference between the G signal and the R signal in the periphery of the photo acceptance portion is not larger than 90 degrees in the worst case so that false color becomes comparatively inconspicuous.

Although the chief light ray 221 incident obliquely is actually refracted on interfaces between the respective constituent members in accordance with refractive indices of the respective constituent members, the chief light ray 221 is illustrated as a straight line simply in the example of FIG. 1. In addition, it is a matter of course that inclination of the incidence direction of the chief light ray in an opposite end portion of the photo acceptance becomes reverse.

In the photoelectric conversion layer stack type color solid-state image sensing device 200 according to the embodiment shown in FIG. 1, the area of each of the R pixel and the B pixel is smaller than the area of the G pixel. This is because signal reading circuits etc. as well as the photodiodes (R pixels and B pixels) need be produced in the surface portion of the semiconductor substrate 201. Accordingly, sensitivity of each of the R pixel and the B pixel is lower than that of the G pixel. In order to improve the sensitivity, a micro lens is preferably stacked on each G pixel constituting each unit cell. Thus, condensing efficiency of light incident on the R pixel and the B pixel can be increased while lowering of sensitivity of the G pixel can be suppressed.

Second Embodiment

Figure 2:
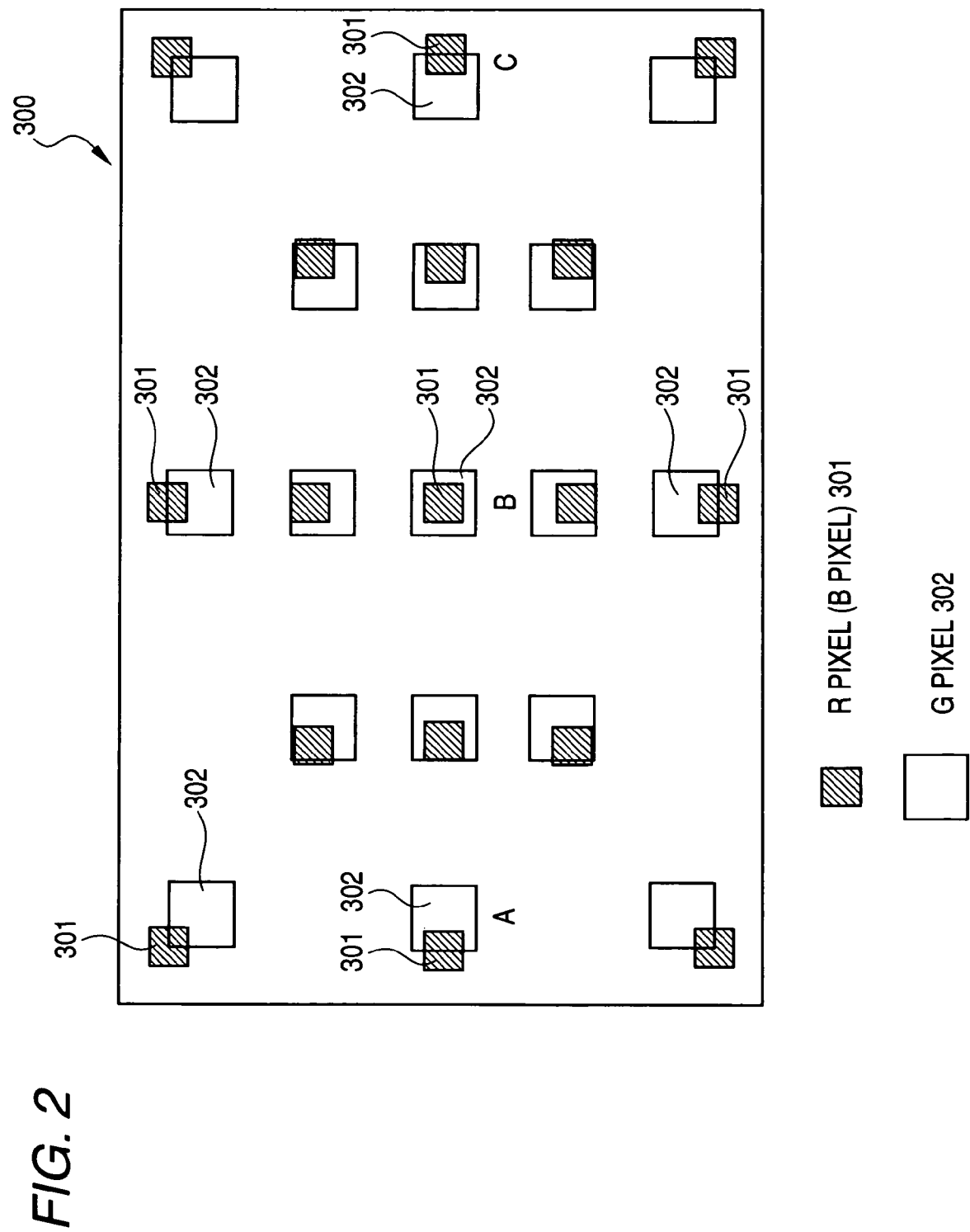
FIG. 2 is a planar schematic view of a hybrid photoelectric conversion layer stack type color solid-state image sensing device according to a second embodiment of the invention.
Figure 4:
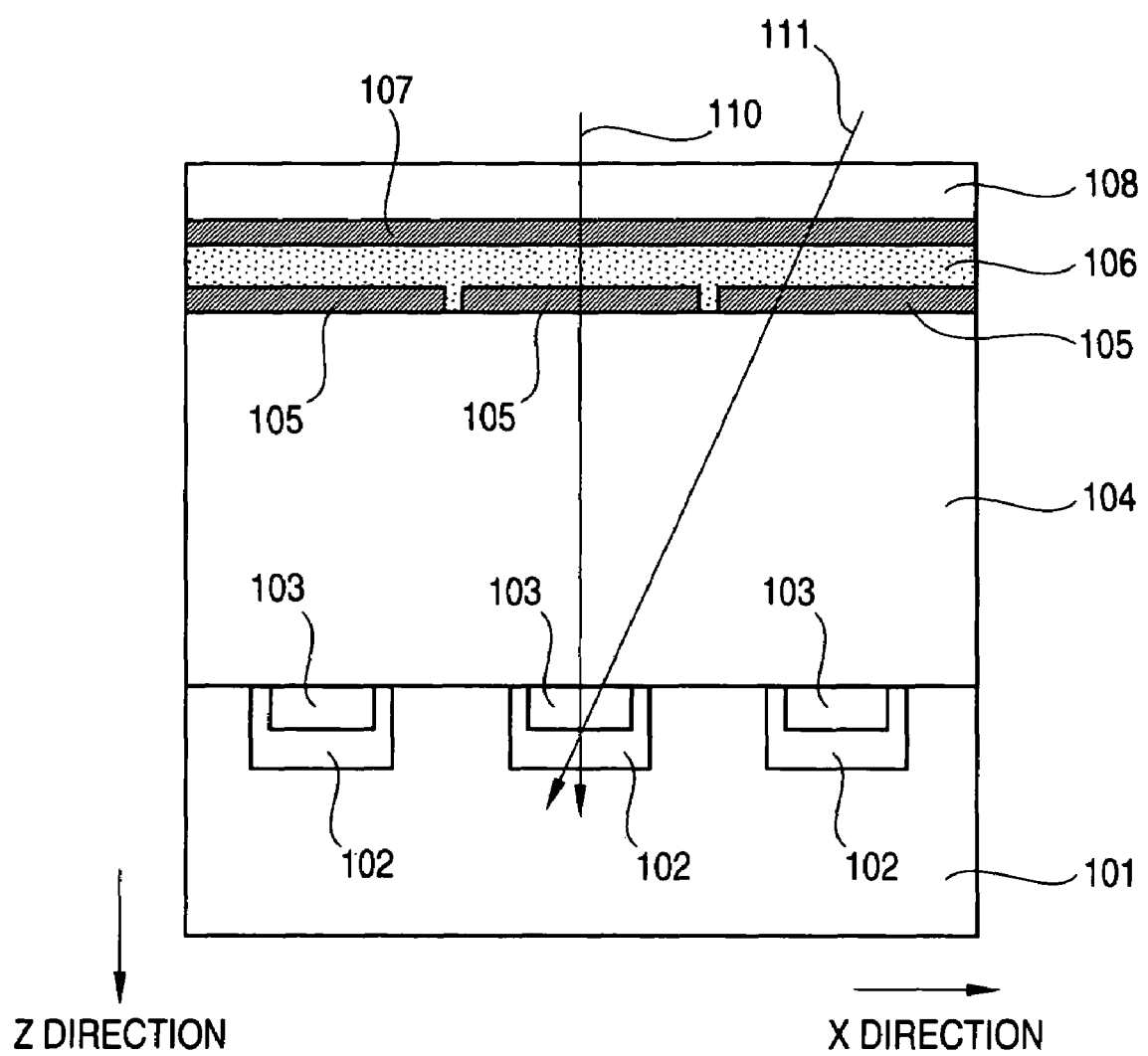
FIG. 4 is a schematic view of a section of a hybrid photoelectric conversion layer stack type color solid-state image sensing device according to the background art.

FIG. 2 is a planar schematic view of photo acceptance portions of a photoelectric conversion layer stack type color solid-state image sensing device according to a second embodiment of the invention. FIGS. 3A to 3C are schematic views of sections of unit cells in points A, B and C in FIG. 2, respectively. The fundamental configuration of a photoelectric conversion layer stack type color solid-state image sensing device 300 according to the embodiment is the same as that in the first embodiment shown in FIG. 1, so that constituent members the same as those in FIG. 1 are referred to by the same numerals and description thereof will be omitted. Here, description will be given to the different part.

In the photoelectric conversion layer stack type color solid-state image sensing device 300 according to the embodiment, a G pixel and an R pixel (and a B pixel) constituting a unit cell are provided to be arranged in a direction vertical to the surface of the substrate 201 in the central portion (point B in FIG. 2: FIG. 3B) of the image sensing device 300. As the location goes toward the periphery of the image sensing device 300, the G pixel is formed to be shifted from the R pixel in a direction of the central point B. That is, as the location goes to the periphery of the image sensing device 300, a part of a pixel electrode layer 208 is formed to be shifted in the direction of the central point B. The shift quantity is monotonically increased in accordance with the distance from the central point B.

That is, in a unit cell in the point A in the vicinity of a left end portion of the image sensing device 300, as shown in FIG. 3A, a chief light ray 321 is incident from the upper right direction to the lower left direction. Accordingly, a G pixel 302 (pixel electrode layer 208) constituting one unit cell together with an R pixel 301 is formed to be shifted in the incidence direction of the chief light ray 321, i.e. rightward as illustrated in FIG. 2.

In a unit cell in the point C in the vicinity of a right end portion of the image sensing device 300, as shown in FIG. 3C, a chief light ray 322 is incident from the upper left direction to the lower right direction. Accordingly, a G pixel 302 (pixel electrode layer 208) constituting one unit cell together with an R pixel 301 is formed to be shifted in the incidence direction of the chief light ray 322, i.e. leftward as illustrated in FIG. 2.

In the aforementioned first embodiment, selection of the condition $P \geq W$ is an essential condition. When a pitch between adjacent ones of the unit cells is reduced in order to increase the number of the pixels, the condition is not allowed to be satisfied. Even in the case where the condition $P \geq W$ can be selected, it is preferable that false color is reduced more greatly.

In the embodiment, as the position of the G pixel 302 goes toward the periphery of the photo acceptance portion of the image sensing device 300, the position of the G pixel 302 is formed to be shifted in the central (point B in FIG. 2) of the photo acceptance portion from the R pixel 301 of one unit cell and generation of false color is reduced more greatly. The quantity of shift of the G pixel 302 depends on inclination of the chief light ray, i.e. an optical system. In a design stage of the image sensing device 300, the optical system to be used is assumed and an optimal quantity of shift can be determined.

When the quantity of shift of the G pixel in each unit cell is optimized in the whole surface of the photo acceptance portions of the image sensing device 300 in the aforementioned manner, the phase difference between the G pixel and the R pixel with respect to the Nyquist frequency in the whole region of the photo acceptance portions can be reduced to be substantially zero in principle so that generation of false color can be prevented. Even when $P<W$, the phase difference between the G pixel and the R pixel can be reduced to be substantially zero in principle. When the pitch P is really reduced, it becomes difficult to adjust the phase difference to be zero but it is easy to suppress the phase difference to be not smaller than 10 degrees and not larger than 30 degrees. Accordingly, false color can be made substantially inconspicuously.

Even in the photoelectric conversion layer stack type color solid-state image sensing device 300 according to the embodiment, the area of each of the R pixel and the B pixel is smaller than the area of the G pixel. For this reason, in the same manner as in the first embodiment, a micro lens is preferably stacked on a G pixel constituting each unit cell. In the case of the embodiment, the quantity of shift of the micro lens is selected so that the chief light ray passing through the center of the micro lens passes through the vicinity of the center of gravity in the sensitivity distribution of the G pixel of the unit cell and the vicinity of the center of gravity in the sensitivity distribution of the R pixel of the unit cell. Thus, reduction of false color and improvement of sensitivity can be achieved simultaneously.

In the embodiment, in addition to the aforementioned configuration, (the aperture position of) the light blocking layer 206 is also formed to be shifted in the same direction as the G pixel, but not as largely as the G pixel. When the aperture of the light blocking layer 206 is formed in the same position in a direction vertical to the photo acceptance surface of the B pixel of the unit cell, the chief light ray 321, 322 incident obliquely is blocked from being incident on the photo acceptance surface of the photodiode as the electrically insulating layer 205 on which the light blocking layer 206 is formed is thicker, or the pitch P is smaller. Thus, shading occurs conspicuously.

In the embodiment, therefore, the shift quantity of the aperture is adjusted so that the chief light ray passing through the center of gravity in the sensitivity distribution of the G pixel of the unit cell passes through the vicinity of the center of the aperture of the light blocking layer 206 and the vicinity of the center of gravity in the sensitivity distribution of the R pixel. Accordingly, the quantity of light excluded by the light blocking layer 206 is reduced so that the sensitivity of the peripheral portion of the image sensing device 300 is improved.

Incidentally, although this embodiment has been described on the case where the G pixel, i.e. the part of the pixel electrode layer is shifted from the R pixel, it is a matter of course that the position where the R pixel (and the B pixel) may be formed is shifted from the G pixel.

Since generation of false color in the periphery of the photo acceptance portion is suppressed in the photoelectric conversion layer stack type color solid-state image sensing device according to the invention, the invention is useful when the photoelectric conversion layer stack type color solid-state image sensing device according to the invention is used in place of a CCD or CMOS image sensor according to the background art.

This application is based on Japanese Patent application JP 2005-88468, filed Mar. 25, 2005, the entire content of which is hereby incorporated by reference, the same as if set forth at length.

What is claimed is:

1. A color solid-state image sensing device comprising:
   unit cells, each unit cell including a blue pixel for detecting blue light, a red pixel for detecting red light, and a green pixel for detecting green light, the blue pixel being provided as a photodiode disposed in a surface of a silicon substrate, the red pixel being provided as a photodiode disposed under the blue pixel, and the green pixel being provided as a photoelectric conversion layer stacked above the silicon substrate so as to be interposed between a corresponding part of a pixel electrode layer partitioned into parts in accordance with the unit cells and a common electrode layer, the blue pixel, the red pixel and the green pixel being arranged such that the relation $P \geq W$ holds where W is a distance between the position of the center of gravity in a sensitivity distribution of the green pixel and the position of the center of gravity in a sensitivity distribution of the red pixel in a direction perpendicular to the surface of the silicon substrate, and P is a pitch of arrangement of the unit cells.

2. The color solid-state image sensing device as claimed in claim 1, wherein micro lenses are provided above the green pixels respectively.

3. A color solid-state image sensing device comprising:
unit cells, each unit cell including a blue pixel for detecting blue light, a red pixel for detecting red light, and a green pixel for detecting green light, the blue pixel being provided as a photodiode disposed in a surface of a silicon substrate, the red pixel being provided as a photodiode disposed under the blue pixel, the green pixel being provided as a photoelectric conversion layer stacked above the silicon substrate so as to be interposed between a corresponding part of a pixel electrode layer partitioned into parts in accordance with the unit cells and a common electrode layer, wherein as the position of each of the unit cells arranged two-dimensionally becomes farther from the center of a photo acceptance portion of the image sensing device, the position of the green pixel included in each of the unit cells is shifted toward the center of the photo acceptance portion of the image sensing device by a shift quantity relative to the position of the red pixel included in each of the unit cells.

4. The color solid-state image sensing device as claimed in claim 3, wherein the shift quantity is determined in accordance with inclination of a chief light ray incident on the unit cell.

5. The color solid-state image sensing device according to claim 3, wherein: a light blocking layer having apertures disposed on the blue pixels respectively is disposed on the silicon substrate; and each of the apertures of the light blocking layer is shifted toward the center of the photo acceptance portion of the image sensing device in accordance with inclination of the chief light ray.

6. The color solid-state image sensing device according to claim 4, wherein: a light blocking layer having apertures disposed on the blue pixels respectively is disposed on the silicon substrate; and each of the apertures of the light blocking layer is shifted toward the center of the photo acceptance portion of the image sensing device in accordance with inclination of the chief light ray.

7. The color solid-state image sensing device as claimed in claim 3, wherein micro lenses are provided above the green pixels respectively.

8. The color solid-state image sensing device as claimed in claim 7, wherein each of the micro lenses is shifted relative to corresponding one of the green pixels in accordance with inclination of a chief light ray incident on the unit cell including the respective green pixel.

9. The color solid-state image sensing device as claimed in claim 1, wherein regions for storing signal charge detected by the green pixels and signal reading circuits for reading signals from the regions, the blue pixels and the red pixels respectively are disposed in the surface portion of the silicon substrate.

10. The color solid-state image sensing device as claimed in claim 3, wherein regions for storing signal charge detected by the green pixels and signal reading circuits for reading signals from the regions, the blue pixels and the red pixels respectively are disposed in the surface portion of the silicon substrate.

11. The color solid-state image sensing device as claimed in claim 1, wherein the photoelectric conversion layer is made of organic semiconductor.

12. The color solid-state image sensing device as claimed in claim 3, wherein the photoelectric conversion layer is made of organic semiconductor.

13. The color solid-state image sensing device as claimed in claim 3, wherein the pixel electrode layer is disposed on a top surface of an insulating layer, and the center of the photo acceptance portion of the image sensing device is the center of the top surface of the insulating layer.

14. The color solid-state image sensing device as claimed in claim 1, wherein the position of the center of gravity in the sensitivity distribution of the green pixel is above the silicon substrate, and the position of the center of gravity in the sensitivity distribution of the red pixel is within the silicon substrate, wherein W is the distance between the position of the center of gravity in the sensitivity distribution of the green pixel above the silicon substrate and the position of the center of gravity in the sensitivity distribution of the red pixel within the silicon substrate.

* * * * *